(12) United States Patent
Salvin et al.

(10) Patent No.: US 7,387,812 B2
(45) Date of Patent: *Jun. 17, 2008

(54) HEAT-CURABLE RESIN COMPOSITION

(75) Inventors: Roger Pierre-Elie Salvin, Basel (FR); Martin Roth, Hölstein (CH); Masato Hoshino, Tokyo (JP); Yasuharu Nojima, Osaka (JP)

(73) Assignee: Huntsman Advanced Materials Americas Inc., The Woodlands, TX (US)

( * ) Notice: Subject to any disclaimer, the term of this patent is extended or adjusted under 35 U.S.C. 154(b) by 73 days.

This patent is subject to a terminal disclaimer.

(21) Appl. No.: 10/498,036

(22) PCT Filed: Nov. 21, 2002

(86) PCT No.: PCT/EP02/13047

§ 371 (c)(1),
(2), (4) Date: Oct. 5, 2004

(87) PCT Pub. No.: WO03/048235

PCT Pub. Date: Jun. 12, 2003

(65) Prior Publication Data

US 2005/0032935 A1    Feb. 10, 2005

(30) Foreign Application Priority Data

Dec. 6, 2001 (CH) .................................. 2229/01

(51) Int. Cl.
C08J 7/04 (2006.01)
C08J 3/28 (2006.01)
B32B 3/10 (2006.01)
G03C 1/00 (2006.01)

(52) U.S. Cl. .................. 427/96; 427/510; 428/209; 522/111; 522/112; 522/102

(58) Field of Classification Search ............... 428/209; 522/109–112, 102; 525/92 G; 427/96, 510
See application file for complete search history.

(56) References Cited

U.S. PATENT DOCUMENTS

| | | | | |
|---|---|---|---|---|
| 4,438,189 A | * | 3/1984 | Geissler et al. | 430/280.1 |
| 4,894,315 A | * | 1/1990 | Feinberg et al. | 430/281.1 |
| 4,925,773 A | * | 5/1990 | Miyamura et al. | 430/285.1 |
| 4,977,220 A | | 12/1990 | Dougherty et al. | |
| 5,051,469 A | | 9/1991 | Udipi | |
| 5,360,836 A | | 11/1994 | Chevallier et al. | |
| 5,539,064 A | * | 7/1996 | Hashimoto et al. | 525/529 |
| 5,569,545 A | * | 10/1996 | Yokono et al. | 428/626 |
| 5,910,542 A | * | 6/1999 | St. Clair et al. | 525/99 |
| 6,127,094 A | * | 10/2000 | Victor et al. | 430/284.1 |
| 6,287,745 B1 | * | 9/2001 | Yamamura et al. | 430/269 |
| 6,465,540 B1 | * | 10/2002 | Kubo et al. | 522/100 |
| 6,583,198 B2 | * | 6/2003 | Sato et al. | 522/100 |
| 6,894,113 B2 | * | 5/2005 | Court et al. | 525/88 |
| 2003/0000735 A1 | * | 1/2003 | Otsuki et al. | 174/250 |
| 2005/0032946 A1 | * | 2/2005 | Salvin et al. | 524/186 |
| 2005/0175925 A1 | * | 8/2005 | Johnson et al. | 430/270.1 |

FOREIGN PATENT DOCUMENTS

| | | |
|---|---|---|
| EP | 0 565 425 A1 | 10/1993 |
| EP | 0 662 501 A1 | 7/1995 |
| JP | 8134390 | 5/1996 |
| WO | WO 94/03545 * | 2/1994 |
| WO | WO 98/05694 | 2/1998 |

* cited by examiner

*Primary Examiner*—Susan W. Berman

(57) ABSTRACT

The present invention relates to a resin composition comprising an at least bifunctional prepolymer (A) curable under the action of heat, a telechelic elastomer and a particulate material having an elastomeric core and a thermoplastic shell. Layers and patterns which are produced using the formulation according to the invention have excellent adhesion properties, chemical stability, good electrical properties and high resistance to rapid temperature ranges. The compositions are suitable in particular as solder resists in the production of circuit boards.

19 Claims, No Drawings

HEAT-CURABLE RESIN COMPOSITION

The present invention relates to a heat-curable composition and the use of this composition in the field of circuit boards. The invention also relates to a heat-curable and photocurable composition and its use in the field of circuit boards.

In the production of printed circuits, a protective film is applied to a printed circuit board to protect the electrical circuit and to prevent adhesion of solder material in undesired areas when electrical parts are soldered onto the printed circuit board. The considerable demand for increasingly light circuit boards and the resultant high density of circuits mean that the compositions have to have excellent adhesion properties, chemical stability, good electrical properties and high resistance to rapid temperature changes.

U.S. Pat. No. 5,009,982 describes a photocurable composition which can be developed in an alkaline medium.

It has now surprisingly been found that cured layers which have outstanding electrical properties and which are distinguished by excellent resistance to heat occurring during soldering, high moisture resistance and mechanical strength and by high resistance to rapid temperature changes are obtained if compositions contain (1) a heat-curable prepolymer, (2) a telechelic elastomer and (3) particles having a core of elastomeric material and a shell of a thermoplastic material are used.

Surprisingly, this composition is extremely resistant to rapid temperature change. After application to a support and subsequent curing, the composition shows no new tears after more than 1 000 cycles with thermal shocks of −55° C. for 15 minutes and +125° C. for 15 minutes.

The invention relates to a composition comprising
(1) an at least bifunctional prepolymer (A) curable under the action of heat,
(2) a telechelic elastomer, and
(3) a particulate material having an elastomeric core and a thermoplastic shell.

Further advantageous embodiments of the invention are evident from the dependent claims and the description.

The telechelic elastomer is a macromolecule having a low molar mass and having a reactive terminal group. The telechelic elastomer contained in the formulation according to the invention preferably contains a hetero atom. The telechelic elastomer having at least one primary hydroxyl group at one end of the molecule and at least one epoxidized polyisoprene group at the other end of the molecule is preferably of the general formula I

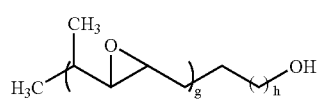

in which g is a number from 1 to 20 and h a number from 1 to 400.

The telechelic elastomer is preferably added alone or in solution or dispersion in an epoxy compound or in a solvent to the composition according to the invention. The composition according to the invention contains from 1 to 10%, preferably from 2 to 6%, of the telechelic elastomer, based on the composition according to the invention. With these proportions, layers produced using the composition according to the invention exhibit increasingly high tear resistance under repeated cold/hot cycles. Moreover, the telechelic elastomers do not adversely affect the heat resistance and the curing behaviour of the photocurable polymer. A particularly preferred telechelic elastomer is the Kraton Liquid EKP-207 polymer (Shell Chemicals Eschborn, Germany).

The particulate material contained in the composition according to the invention and having an elastomeric core and a thermoplastic shell comprises discrete particles. The elastomeric core preferably contains silicone resins. The thermoplastic shell preferably contains acrylate resin, such as PMMA or GMA/MMA copolymer. In a particularly preferred embodiment, the shell of the particulate material has the same structure as the telechelic elastomer or a structure similar to that of said elastomer. The particle size distribution of the particulate material having a shell and core is preferably very narrow and is preferably in the range from 5 to 200 nm. The particulate material having a shell and core is preferably dispersed in an epoxy compound. The formulation according to the invention preferably contains 1 to 10%, particularly preferably 2 to 5%, of the particles having a shell and core. The particles having a shell and core act like a mechanical spring in a layer produced using the formulation according to the invention.

The ratio of the telechelic elastomer to the particles having a shell and core is preferably in the range from 1:5 to 5:1. Surprisingly, it has been found that the particles having a shell and core and the telechelic elastomer each by themselves improve not only the properties of the composition according to the invention but even cooperate in improving the thermal shock resistance. As a result of the combination, the layer produced using the composition according to the invention has a sufficiently high resistance to rapid cold/hot cycles. Thus, on the one hand, the formation of new tears is reduced and, on the other hand, existing tears can no longer propagate.

As a result of the combination of the particles having a shell and core and the telechelic elastomer, the protected films formed by the composition according to the invention also have high resolution, excellent antitack properties, photocuring properties (high sensitivity), developability (can be developed over a long time), adhesion properties, chemical stability, soldering heat resistance, electrical properties under humid conditions, resistance to metallization and corrosion resistance, in addition to the resistance to rapid temperature changes.

The at least bifunctional prepolymer curable by the action of heat is preferably selected from the group consisting of the epoxy compounds having more than one epoxide group per molecule, the acrylate resins, the polyurethane resins, the cyanate ester resins, the benzoxazine resins, the polyphenylene resins, the polyimide resins and mixtures thereof. Such prepolymers are generally known and commercially available.

The composition according to the invention particularly preferably comprises an epoxy compound as heat-curable prepolymer (A), it being possible to use known epoxy compounds in solid or liquid form. The epoxy compound is chosen by a person skilled in the art so that the protective film acquires the desired properties. If, for example, the plating resistance is to be improved, a liquid epoxy resin is used. If, on the other hand, the water resistance is to be increased, epoxy compounds having methylated benzene rings or having cyclic rings are suitable. Examples of preferred epoxy compounds are bisphenol S type epoxy resins, such as EBPS-200 (product of Nippon Kayaku), EPX-30 (product of ACR Co.), Epicon EXA-1514 (product of Dainippon Ink Chemicals), etc.; diglycidyl phthalate resin, such as Plemmer DGT (product of Nippon Yushi), etc.; heterocyclic epoxy resins, such as TEPIC (product of Nissan Kagaku AG), Araldite PT810 (product of Ciba Geigy Inc.), etc.; bixylenol type epoxy resins, such as YX-4000 (product of Yuka Shell AG), etc.; biphenol type epoxy resins, such as YL-6056 (product of Yuka Shell), etc.; and tetraglycidylxylenolethane resin, such as ZX-1063 (product of Tohto Kasei AG); novolak type epoxy resins, such as EPPN-201, EOCN-103, EOCN-1020, EOCN-1025 and BREN (products of Nippon Kayaku AG), ECN-278, ECN-292 and ECN-299 (products of Asahi Chemicals), ECN-1273 and ECN-1299 (products of Ciba Geigy Inc.), YDCN-220L, YDCN-220HH, YDCN-702, YDCN-704, YDPN-601 and YDPN-602 (products of Tohto Kasei AG), Epiclon673, N-680, N-695, N-770 and N-775 (products of Dainippon Ink Chemicals AG); bisphenol A type novolak epoxy resins, such as EPX-8001, EPX-8002, EPPX-8060 and EPPX8061 (products of Asahi Chemicals), Epiclon N-880 (product of Dainippon Ink Chemicals AG), etc.; chelate-like epoxy resins, such as EPX-49-60, EPX-49-30, etc. (products of Asahi Denka Kogyo); glyoxal type epoxy resins, such as YDG-414 (product of Tohto Kasei AG), etc.; epoxy resins containing amino groups, such as YH-1402 and ST-110 (products of Tohto Kasei AG), YL-931 and YL-933 (products of Yuka Shell AG); rubber-modified epoxy resins, such as Epiclon TSR-601 (product of Dainippon Ink Chemicals), EPX-84-2, EPX4061 (products of Asahi Denka), etc.; dicyclopentadiene-phenolic epoxy resins, such as DCE-400 (product of Yamawaki Kokusaku Pulp AG), etc.; silicone-modified epoxy resins, such as X-1359 (product of Asahi Denka Kogyo AG), etc.; and ε-cprolactone-modified epoxy resin, such as Plac G402, G-710 (products of Daicel Chemicals); etc.; and epoxy resins partially esterified with (meth)acrylic acid.

Further examples of the prepolymers curable by the action of heat are Epikote® 180S70 (Yuka Shell Epoxy AG), Epiclone® N-670, Epiclone® N-673, Epiclone® N680, Epiclone® N-690 and Epiclone® N-775 (Dainippon Ink Chemicals AG), ECN-1273, ECN-1280 (Ciba Geigy AG), etc.

In a preferred embodiment, the composition according to the invention comprises, based on the total composition,
from 1 to 10% by weight of a telechelic elastomer,
from 1 to 10% by weight of a particulate material having an elastomeric core and a thermoplastic shell,
from 1 to 20% by weight of a diluent,
from 0.1 to 10% by weight of a photopolymerization initiator,
from 0.01 to 7% by weight of an epoxide curing agent,
from 5 to 20% by weight of a prepolymer curable by the action of heat,
from 20 to 60% by weight of a photocurable prepolymer and
from 5 to 30% by weight of at least one inorganic and/or at least one organic filler.

The composition according to the invention preferably additionally comprises a photocurable prepolymer (B) which is selected from the group consisting of:
a photocurable prepolymer having an acid value of from 40 to 250 mg KOH/g, obtainable by reacting an unsaturated monobasic acid copolymer resin with a compound which contains an alicyclic epoxy group;
a photocurable prepolymer obtainable by complete esterification of the epoxy groups of an epoxy resin with an α,β-unsaturated carboxylic acid with formation of a product and subsequent reaction of the product thus obtained with a saturated or an unsaturated polybasic acid anhydride;
a photocurable prepolymer obtainable by reaction of a bisphenol A type epoxy resin with epichlorohydrin with formation of a postglycidylated epoxy resin, subsequent complete esterification of the epoxy groups of the postglycidylated epoxy resin with an α,β-unsaturated carboxylic acid with formation of a product and subsequent reaction of the product thus obtained with a saturated or an unsaturated polybasic acid anhydride; and
a photocurable prepolymer obtainable by reaction of a bisphenol A type epoxy resin with epichlorohydrin with formation of a postglycidylated epoxy resin, mixing of the postglycidylated epoxy resin with a novolak epoxy resin, complete esterification of the mixture with an α,β-unsaturated carboxylic acid with formation of a product and subsequent reaction of the product thus obtained with a saturated or unsaturated polybasic acid anhydride.

The abovementioned unsaturated monobasic acid copolymer resins are obtainable by copolymerization of an ethylenically unsaturated acid, such as, for example, (meth)acrylic acid, 2-carboxyethyl (meth)acrylate, 2-carboxypropyl (meth)acrylate, maleic anhydride and the like, with at least one monomer selected from the group consisting of (meth)acrylic esters, such as methyl (meth)acrylate, ethyl (meth)acrylate, propyl (meth)acrylate, butyl (meth)acrylate, 2-ethylhexyl (meth)acrylate, stearyl (meth)acrylate, hydroxyethyl (meth)acrylate, hydroxypropyl (meth)acrylate and the like; vinylaromatic compounds, such as styrene, α-methylstyrene, vinyltoluene, p-chlorostyrene and the like; amide-like unsaturated compounds, such as (meth)acrylamide, diacetoneacrylamide, N-methylolacrylamide, N-butoxymethylacrylamide and the like; polyolefin compounds, butadiene, isoprene, chloroprene and the like; and other compounds, such as (meth)acrylonitrile, methyl isopropenyl ketone, vinyl acetate, beoba monomer (product of Shell Chemical), vinyl propionate, vinyl pivalate and the like. The acid value of the unsaturated monobasic acid copolymer resin is preferably in the range from 30 to 260 mg KOH/g.

An unsaturated compound containing an alicyclic epoxy group may be, for example, one having an unsaturated group capable of free radical polymerization and an alicyclic epoxy group in a molecule. This unsaturated compound containing an alicyclic epoxy group is obtainable by copolymerization of an unsaturated monomer as the main monomer component containing an alicyclic epoxy group with at least one monomer described above, such as (meth)acrylic esters, vinylaromatic compounds and the like.

The resin containing an unsaturated group and obtained from an unsaturated resin containing an alicyclic epoxy group and an unsaturated compound containing an acid group is obtainable by reacting a solution of the unsaturated resin containing an alicyclic epoxy group in an inert organic solvent with the unsaturated compound containing the acid group at a temperature of from 20 to 110° C. for from 1 to 7 hours. The resin thus obtained may contain from 0.2 to 4.0, preferably from 0.7 to 3.5, double bonds per 1 000 molecular weight units and preferably has an average molecular weight of from 1 000 to 100 000 g/mol, preferably from 3 000 to 20 000 g/mol.

The following general formula shows a photocurable resin which is preferably contained in the composition according to the invention:

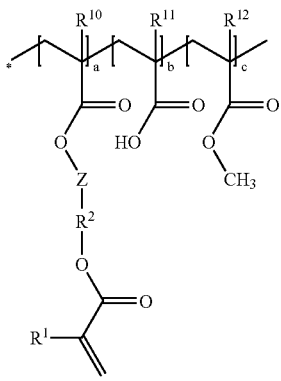

in which
R¹ is hydrogen or a methyl group;
R² is a divalent aliphatic saturated hydrocarbon group having 1-14 carbon atoms and in particular a linear or branched alkylene chain, such as methylene, ethylene, propylene, tetramethylene, ethylethylene, pentamethylene, hexamethylene or the like, and phenylene;
R¹⁰, R¹¹ and R¹², independently of one another, are hydrogen or a methyl group;
Z is a direct bond or a cycloalkylene having 5 to 10 carbon atoms;
a is a number from 1 to 10 and b and c, independently, numbers from 0 to 10.

The ratio a:b:c is preferably 5:3:2. The acid value is preferably in the range of 60-90 mg KOH/g, since, in this range, the composition is more stable and has the best properties. The molecular weight is preferably in the range of 400-6000 g/mol.

For the preparation of a resin containing an unsaturated group from an acrylic resin containing an acid group and an unsaturated compound containing an alicyclic epoxy group, for example, a solution of an acrylic resin containing an acid group in an inert organic solvent, such as alcohols, esters, aromatic hydrocarbons and the like, can be reacted with the unsaturated compound containing the alicyclic epoxy group at a temperature of from 20 to 120° C. for from 1 to 5 hours.

The resin containing the unsaturated groups may contain unsaturated groups in the range from 0.2 to 4.0, preferably from 0.7 to 3.7, per 100 molecular weight units. If the number of unsaturated groups is in this range, good curing is achieved and the adhesive properties with respect to the substrate and the resistance to water are ideal.

The photocurable prepolymers may have an average molecular weight of from 1 000 to 100 000 and preferably from 3 000 to 70 000. With such a molecular weight, the photocurable prepolymer can be readily used owing to its viscosity. The acid value of the photocurable resin is preferably in a range up to 120 mg KOH/g, since the composition according to the invention then has good water resistance.

Alternatively, a photocurable prepolymer which is obtained by reacting a vinyl resin containing an alicyclic epoxy group and an unsaturated compound containing an acid group may also be present in the composition according to the invention.

The abovementioned photocurable prepolymers may be present alone or in combination in the composition according to the invention.

In a preferred embodiment, at least one epoxy compound can be mixed with the photocurable resin, the type of such a mixture depending on the desired properties of a solder resist. In such a mixture, the photocurable resin should preferably have a higher proportion by weight than the epoxy resin, since, as a result, the negative is not influenced by adhesion during exposure, the cured surface has a regular gloss and the alkaline development takes place satisfactorily. The combination of the photocurable prepolymer and the epoxy compound leads to excellent properties of the resist film formed with the composition according to the invention in respect of the heat resistance, adhesion properties and flexibility.

In a particularly preferred embodiment, the formulation according to the invention additionally comprises a compound of the formula (III)

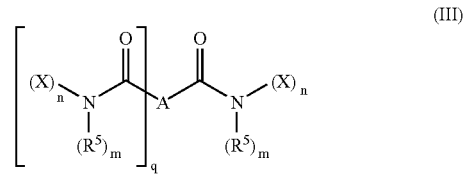

(III)

in which A is a mono- to tetravalent, saturated or unsaturated alkyl group having 1 to 60, preferably 1 to 30 and particularly preferably 1 to 20 carbon atoms, such as, for example, ethyl, methyl, propyl, butyl, pentyl, hexyl, heptyl, octyl, nonyl, decyl, eicosyl, tricontyl, tetracontryl, pentacontyl or hexacontyl, a mono- to tetravalent aryl group, such as phenyl or naphthyl, a monovalent dialkylamino group or a divalent monoalkyl group having 1 to 4 carbon atoms, such as methylamine or diethylamine, or a mono- to tetravalent alkenyl group having 1 to 4 carbon atoms, such as ethenyl, 1-methylethenyl; 3-butenyl-1,3-diyl and 2-propenyl-1,2-diyl; carboxyalkylene groups such as 3-carboxy-2-propylene groups; alkoxycarbonylalkenyl groups having 1 to 4 carbon atoms, such as 3-methoxycarbonyl-2-propenyl groups, n is 1 or 2, m is 2−n and q is a number from 0 to 3.

Particularly preferably, n is 2 and m is 0.

In the compound of the formula III, X is

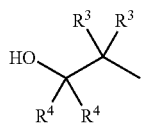

in which R³ and R⁴ are identical or different and each radical, independently of one another, is hydrogen or a straight-chain or branched alkyl group or hydroxyalkyl group having 1 to 5 carbon atoms, or R³ and R⁴ together form a ring (such as cyclopentyl, cyclohexyl, hydroxymethyl and 1-hydroxyethyl);
R⁵ is hydrogen or an alkyl group having 1 to 5 carbon atoms (such as methyl, ethyl, n-propyl, n-butyl, sec-butyl, tert-butyl or pentyl) or a hydroxyalkyl group having 1 to 5 carbon atoms (such as 2-hydroxyethyl, 3-hydroxypropyl, 2-hydroxypropyl, 4-hydroxybutyl, 3-hydroxybutyl or 2-hydroxy-2-methylpropyl).

Particularly preferably, the formulation according to the invention additionally comprises a compound of the formula IV

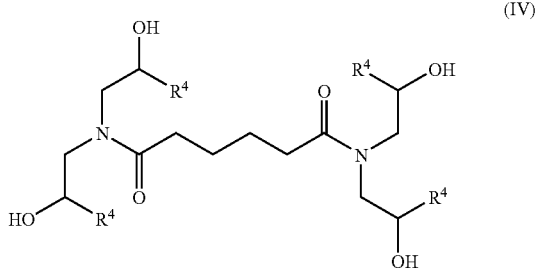

in which $R^4$ has the same definition as above and is preferably hydrogen or a methyl group. Such a formulation can be extremely readily crosslinked at temperatures above 120° C. and thus forms layers which are resistant to solvents.

A diluent which is, for example, a photopolymerizable vinyl monomer and/or an organic solvent is preferably added to the composition according to the invention.

The photopolymerizable vinyl monomers are preferably selected from the group consisting of hydroxyalkyl acrylates, such as 2-hydroxyethyl acrylate, 2-hydroxybutyl acrylate and the like; mono- or diacrylates of glycols, such as, for example, ethylene glycol, methoxytetraethylene glycol, polyethylene glycol, propylene glycol and the like, ethylene glycol diacrylate, diethylene glycol diacrylate and the like; acrylamides, such as N,N-dimethylacrylamide N-methylolacrylamide methylenebisacrylamide, diethylenetriaminetriacrylamide, bisacrylamidopropoxyethane, bismethacrylamidoethyl methacrylate, N-[(β-hydroxyethyloxy)ethyl] acrylamide and the like, aminoalkyl acrylates, such as N,N-dimethylaminoethyl acrylate and the like; polyvalent acrylates of polyols, such as hexanediol, trimethylolpropane, pentaerythritol, dipentaerythritol, trihydroxyethyl isocyanurate and the like, and ethylene oxide adducts thereof or propylene oxide adducts; phenoxyacrylates, bisphenol A diacrylate and acrylates of ethylene oxide adducts and propylene oxide adducts of these phenols; acrylates of glycidyl ethers, such as glyceryl diglycidyl ether, trimethylolpropane triglycidyl ether, triglycidyl isocyanurate and the like; melamine acrylate; and methacrylates of the abovementioned acrylates; etc.

The organic solvents are preferably selected from the group consisting of the ketones, such as methyl ethyl ketone, cyclohexanone and the like, aromatic hydrocarbons, such as toluene, xylene, tetramethylbenzene and the like; glycol ethers, such as methylcellosolve, butylcellosolve, methylcarbitol, butylcarbitol, propylene glycol monomethyl ether, dipropylene glycol monoethyl ether, triethylene glycol monoethyl ether and the like; esters, such as ethyl acetate, butyl acetate, acetates of the abovementioned glycol ethers and the like; alcohols, such as ethanol, propanol, ethylene glycol, propylene glycol and the like; aliphatic hydrocarbons, such as octane, decanes and the like, and petroleum solvents, such as petroleum ether, petroleum naphtha, hydrogenated petroleum naphtha, naphtha solvents and the like. These organic solvents serve for reducing the viscosity of the composition according to the invention, which leads to an improvement in their application properties.

The diluent can be used alone or as a mixture of a plurality of diluents. The composition according to the invention may contain up to 30%, preferably 10-30%, of the diluent.

By adding the photopolymerizable vinyl monomer as a diluent to the composition according to the invention, not only is the viscosity of said composition reduced but at the same time the photopolymerization rate is increased.

Furthermore, a photopolymerization initiator may be added to the composition according to the invention if the composition is cured by exposure to UV light. Typical examples of photopolymerization initiators are benzoin and benzoin alkyl ethers, such as benzoin, benzil, benzoin methyl ether, benzoin ethyl ether, benzoin n-propyl ether, benzoin n-butyl ether, benzoin isopropyl ether and the like; benzophenones, such as benzophenone, p-methylbenzophenone, Michler's ketone, methylbenzophenone, 4,4'-dichlorobenzophenone, 4,4-bisdiethylaminobenzophenone and the like; acetophenones, such as acetophenone, 2,2-dimethoxy-2-phenylacetophenone, 2,2-diethyoxy-2-phenylacetophenone, 1,1-dichloroacetophenone, 1-hydroxycyclohexyl phenyl ketone, 2-methyl-[4-(methylthio)phenyl]-2-morpholino-1-propanone, N,N-dimethylaminoacetophenone and the like; thioxanthone and xanthones, such as 2,4-dimethylthioxanthone, 2,4-diethylthioxanthone, 2-chlorothioxanthone, 2,4-diisopropylthioxanthone and the like; anthraquinones, such as anthraquinone, chloroanthraquinone, 2-methylanthraquinone 2-ethylanthraquinone, 2-tert-butylanthraquinone, 1-chloroanthraquinone, 2-amylanthraquinone, 2-aminoanthraquinone and the like; ketals, such as acetophenone dimethyl ketal, benzyl dimethyl ketal and the like; benzoic esters, such as ethyl 4-dimethylaminobenzoate, 2-(dimethylamino)ethyl benzoate, ethyl-p-dimethylaminobenzoate and the like; and phenyl disulphides, 2-nitrofluorene, butyloin, anisoin ethyl ether, azobisisobutyronitriles, tetramethylthiuram disulphide and the like. These compounds may be present individually or in combination in the composition according to the invention.

The photopolymerization initiator is preferably present in an amount of from 0.1 to 10 percent by weight, based on the composition according to the invention.

Furthermore, a photopolymerization accelerator in combination with the photopolymerization initiator may be added to the composition according to the invention. The photopolymerization accelerators accelerate the polymerization reaction. Typical examples are tertiary amines, such as triethylamine, triethanolamine, 2-dimethylaminoethanol and the like.

The composition according to the invention may furthermore contain an epoxide curing agent.

This serves for crosslinking the epoxy groups on heating, so that the protective film produced using the composition according to the invention has good heat resistance, moisture resistance and electrical properties. Examples of these are s-triazine compounds, such as melamine, ethyldiamino-s-triazines, 2,4-diamino-s-triazine, 2,4-diamino-6-tolyl-s-triazine, 2,4-diamino-6xylyl-s-triazine and derivatives thereof. Guanidine compounds, such as guanidine, acetoguanidine, benzoguanidine, 3,9-bis[2-(3,5diamino-2,4, 6-triazaphenyl)ethyl]-2,4,8,1 D tetraoxaspiro[5,5]undecane and the like, and s-triazine compounds thereof are latent epoxide curing agents of the epoxy resins. They result in better adhesion between protective film and circuit board. Consequently, corrosion and colour change of the copper can be prevented. Imidazole compounds likewise accelerate the adhesion. Moreover, polyamines, such as diaminodiphenylmethane, m-phenylenediamine, diaminodiphenyl sulphone, cyclohexylamine, n-xylylenediamine, 4,4'-diamino-3,3'-diethyldiphenylmethane, diethylenetriamine, tetraethylenepentamine, N-aminoethylpiperazine, isophoronediamine, dicyandiamide, urea, urea derivatives, polybasic hydrazines and the like, organic acid salts thereof and/or epoxy adducts thereof; tertiary amines, such as trimethylamine, triethanolamine, N,N-dimethyloctylamine, N,N-dimethylaniline, N-benzyldimethylamine, pyridine, N-methylpyridine, N-methylmorpholine, hexamethoxymethylmelamine, 2,4,6-tris(dimethylaminophenol), N-cyclohexyldimethylamine, tetramethylguanidine, m-aminophenol and the like; organic phosphines, such as tributylphosphine, triphenylphosphine, tris-2-cyanoethylphosphine and the like; phosphonium salts, such as tri-n-butyl(2,5-dihydroxyphenyl)phosphonium bromide, hexadecyltributylphosphonium chloride and the like; quaternary ammonium salts, such as benzyltrimethylammonium trichloride, phenyltributylammonium chloride, benzyltrimethylammonium bromide and the like; and photocationic polymerization catalysts, such as diphenyliodonium tetrafluoroborate, triphenylsulphonium hexafluoroantimonate, 2,4,6-triphenylthiopyrylium hexafluorophosphate, Irgacure 261 (product of Ciba Geigy) and the like, are also suitable. The abovementioned epoxide curing agents can be used alone or in combination.

The epoxide curing agents are expediently used in ratios of photocurable polymer to epoxide curing agent of 95:5 or less, preferably 98:2 or less. Because of the presence of the epoxide curing agent in the abovementoned amount, sufficient crosslinking takes place so that the desired water resistance and heat resistance are obtained, making the composition according to the invention particularly preferred compared with the compositions known to date.

The composition according to the invention can also contain inorganic and/or organic fillers in order to improve adhesion properties or hardness of the protective film. The inorganic fillers are preferably selected from the group consisting of barium sulphate, barium titanate, pulverized silicon oxide, finely pulverized silicon oxide, amorphous silica, talc, chalk, magnesium carbonate, calcium carbonate, alumina, aluminium hydroxide, mica powder and the like. The composition according to the invention contains up to 60 percent by weight, preferably 5-40 percent by weight, of inorganic filler.

Allyl compounds, such as diallyl phthalate prepolymer, diallyl isophthalate prepolymer and the like, may be added as organic fillers. The chemical stability can also be increased by adding organic fillers. The formulation according to the invention contains up to 30 percent by weight and particularly preferably up to 20 percent by weight of organic fillers per 100 percent by weight of the photocurable prepolymer. Examples are Daiso Dap and Daiso Isodap, produced by Osaka Soda AG and having an average molecular weight of 2 000-30 000 g/mol, and diallyl isophthalate prepolymers having an average molecular weight of 5 000-20 000 g/mol.

The composition according to the invention may also contain additives, such as dyes, thickeners, antifoams, levelling agents, thermal polymerization inhibitors and antioxidants. Possible dyes are phthalocyanine blue, phthalocyanine green, iodine green, disazo yellow, crystal violet, titanium oxide, carbon black, naphthalene black and the like. Possible thermal polymerizaton inhibitors are hydroquinone, hydroquinone monomethyl ether, tert-butylcatechol, pyrogallol, phenothiazine and the like. Suitable thickeners are, for example, orbene, bentone, montmorillonite and the like. Suitable antifoams are, for example, fluorosilicone-like, fluoride-like or polymer-like antifoams.

The developer liquid used for the production of the protective film is dependent on the choice of the photocurable prepolymer. Suitable developer liquids are organic solvents, such as cyclohexane, xylene, tetramethylbenzene, butylcellosolv, butylcarbitol, propylene glycol monomethyl ether, cellosolve acetates, propanol, propylene glycol, trichloroethane, trichloroethylene, modified trichloroethane [Eterna IR (product of Asahi Kasei Kogyo), Squone EX-R (product of To a Gosei Kagaku), Kanden triethane SR-A (product of Kanto Denka Kogyo), Resisolve V-5 (product of Asahi Glass)], etc., and/or aqueous alkaline solutions, such as aqueous solutions containing potassium hydroxide, sodium hydroxide, sodium carbonate, potassium carbonate, sodium phosphate, sodium silicate, ammonia, amines and the like, and/or aqueous solutions containing a surfactant.

In the production of a circuit board having a layer, the printed circuit board is first coated with the composition according to the invention and then dried for evaporation of the solvent with formation of a film (from 60 to 95° C. for from 15 to 60 minutes). The film is then preferably exposed imagewise with the use of a patterned negative mask. After the exposure, the film is developed with a developer liquid described above in order to remove the unexposed parts of the film. Finally, the film is postcured by heating, a solder resist pattern serving as a protective film being obtained on the circuit board. The heat treatment for postcuring can be carried out at from 100 to 160° C., preferably from 120 to 150° C.

The composition according to the invention is preferably sold in a set comprising two containers A and B. Those components which react together can be separated so that the container A contains the prepolymer curable by the action of heat and the container B contains the remaining ingredients of the composition.

EXAMPLE 1

Telechelic Elastomer

Telechelic elastomers of the general formula I are prepared by anionic polymerization of isoprene followed by an addition reaction of butadiene. These reactions are carried out by the Zielger Natta anionic polymerization technique. Here, butadiene and isoprene are reacted in the presence of an organolithium compound in an aliphatic solvent. The terminal hydroxyl groups are attached by means of a reaction known to a person skilled in the art. The selective hydrogenation serves for removing polybutadiene double bonds in the molecule. Finally, the polyisoprene double bonds are epoxidized. Telechelic elastomers which are prepared as described above are commercially available from German Shell under the trade name Kraton Polymer EKP-207.

EXAMPLE 2

Photocurable Prepolymer

A mixture consisting of 20 parts of methyl methacrylate, 20 parts of styrene, 25 parts of methyl acrylate, 15 parts of 2-hydroxyethyl methacrylate, 20 parts of acrylic acid and 5 parts of azobisisobutyronitrile is added dropwise to 60 parts of butylcellosolve, which is initially introduced into a reactor, in a nitrogen atmosphere over a period of 3 hours. After the addition, the resulting mixture continues to react for one hour. Thereafter, a mixture consisting of 1 part of azobisdimethylvaleronitrile and 7 parts of butylcellosolve is added over a period of one hour and the resulting mixture in turn is reacted for 5 hours. The resin thus formed has a high acid value (150). After addition of 25 parts of an unsaturated resin having an alicyclic epoxy group and 0.06 part of hydroquinone, the resulting mixture is reacted at 80° C. for 5 hours with addition of air. The photocurable prepolymer thus obtained has an acid value of 60 and an average molecular weight of 10 000 g/mol.

EXAMPLE 3

In a nitrogen atmosphere, 50 parts of n-butanol and 40 parts of isobutyl ketone are initially introduced into a reactor at 110° C. A liquid mixture consisting of 30 parts of styrene, 35 parts of butyl acrylate, 35 parts of acrylic acid and 3 parts of azobisisobutyronitrile is added to this over a period of 3 hours. After the addition, the resulting mixture continues to react for 1 hour. Thereafter, a mixture consisting of 1 part of azobisdimethylvaleronitrile and 40 parts of methyl isobutyl ketone is added over a period of 1 hour and the resulting mixture is reacted for a further 5 hours. The acrylic resin thus obtained has an acid value of 260. Thereafter 98 parts of an unsaturated resin having an alicyclic epoxy group and 0.14 part of hydroquinone monomethyl ether are added to this solution and reaction is continued at 80° C. for 5 hours in order to obtain a photocurable prepolymer. The photocurable prepolymer thus obtained has an acid value of about 20, 1.98 mol of unsaturated groups/1 000 molecular weight units and an average molecular weight of about 17 000 g/mol.

EXAMPLE 4

90 parts of n-butanol are initially introduced into a reactor at 110° C. A liquid mixture comprising 40 parts of butyl acrylate, 35 parts of methyl acrylate, 25 parts of acrylic acid and 1 part of azobisisobutyronitrile is added to this over a period of 3 hours. After the addition, the resulting mixture continues to react for 1 hour. Thereafter, a mixture comprising 1 part of azobisdimethylvaleronitrile and 10 parts of methyl isobutyl ketone is added dropwise over a period of one hour and the resulting mixture is reacted for a further 5 hours in order thus to obtain a solution of the acrylic resin having an acid value of 184. Thereafter, 62 parts of an unsaturated resin having an alicyclic epoxy group and 0.12 part of a hydroquinone are added and reaction is carried out at 80° C. for 5 hours in order thus to obtain a solution of a photocurable prepolymer. The photocurable prepolymer has an acid value of 0.2, 0.7 mol of unsaturated groups/1 000 molecular weight units and an average molecular weight of about 30 000 g/mol.

EXAMPLE 5

In a three-necked flask having a stirrer and a condenser, 1.09 parts of cresol novolak type epoxy resin having an epoxide equivalent of 215 (JDCN-702, produced by Tohto Kasei AG) are heated and are melted at 90-100° C. while stirring. 390 parts of acrylic acid, 1 part of hydroquinone and 2 parts of benzyldimethylamine are then added. The mixture is heated to 110-115° C. and reacted for 12 hours while stirring. The solution thus obtained is cooled to room temperature. The resulting product of a novolak type epoxy compound, in which the acrylic acid has been completely esterified, has an acid value of 3 mg KOH/g. 450 parts of this product are introduced into a reactor with 125 parts of ethylcarbitol acetate and 125 parts of Solvesso #150 and stirred at 70-80° C. so that a homogeneous solution forms. One hydroxyl equivalent of the resulting solution is then reacted with 0.5 mol of tetrahydrophthalic anhydride. A solution of the acid anhydride adduct of the completely unsaturated acrylic acid-esterified product of the novolak type epoxy compound having an acid value of 58 mg KOH/g in an organic solvent is obtained.

EXAMPLE 6

In a three-necked flask having a stirrer and a condenser, 1.76 parts of a phenol novolak type epoxy compound having an epoxide equivalent of 176 (EPN1138, produced by Vantico) are heated and are melted at 90-100° C. while stirring. 720 parts of acrylic acid, 10 parts of hydroquinone and 10 parts of benzyldimethylamine are then added. The mixture is heated to 110-115° C., reacted for 12 hours while stirring and then cooled to room temperature. The resulting completely acrylic add-esterified product of a novolak type epoxy compound has an acid value of 3 mg KOH/g. 500 parts of this product are introduced, together with 75 parts of ethylcarbitol acetate and 75 parts of Solvesso #150, into a reactor and stirred at 70-80° C. in order to obtain a homogeneous solution. One hydroxyl equivalent of the resulting solution is then reacted with 0.5 mol of tetrahydrophthalic anhydride. A solution of the acid anhydride adduct of the completely acrylic acid-esterified product of the novolak type epoxy compound having an acid value of 58 mg KOH/g in an organic solvent is obtained.

EXAMPLE 7

The glycidation of a side chain of an epoxy resin can be carried out by known methods as described, for example, in JP-A-8-134390: 100 parts of a bisphenol A type epoxy resin (GT7004, produced by Vantico; softening point 101° C., epoxide equivalent=730, average molecular weight 1 460, n=3.9 on average) are dissolved in a mixture of 171 parts of epichlorohydrin and 116 parts of dimethyl sulphoxide. 15 parts of 98.5% NaOH are added dropwise at 70° C. to this solution over a period of 100 minutes. After the addition, the reaction is carried out in a period of 3 hours at 70° C. The main part of the excess unreacted epichlorohydrin and of the dimethyl sulphoxide is then distilled off under reduced pressure. The reaction product contaminated with dimethyl sulphoxide and the salt formed as a byproduct are dissolved in 187.5 parts of methyl isobutyl ketone. 1.8 parts of 30% NaOH are added to this solution and reaction is effected at 70° C. for 1 hour. After the reaction the reaction mixture is washed with 50 parts of water. After the organic phase has been separated from the aqueous phase, the isobutyl ketone is distilled off from the organic phase in order to obtain 81.2 parts of an epoxy resin having an epoxide equivalent of 305 and a softening point of 83° C. In the epoxy resin, 3.5 mol out of 3.9 mol of the alcoholic OH groups have been epoxidized.

EXAMPLE 8

In a manner analogous to example 7, 100 parts of a bisphenol A type epoxy resin (GT7072, produced by Vantico, softening point 86° C., epoxide equivalent 580, average molecular weight 1 160 g/mol, n=2.9 on average) are dissolved in a mixture of 160 parts of epichlorohydrin and 116 parts of dimethyl sulphoxide. 14 parts of 98.5% NaOH are added at 70° C. to this solution over a period of 100 minutes. After the addition, the reaction is carried out at 70° C. for 3 hours. The main part of the excess of the unreacted epichlorohydrin and of the dimethyl sulphoxide is then distilled off under reduced pressure. The reaction product contaminated with dimethyl sulphoxide and the salt formed as a byproduct are dissolved in 187.5 parts of methyl isobutyl ketone. 1.7 parts of 30% NaOH are added to this solution and reaction is effected at 70° C. for 1 hour. After the reaction, the reaction mixture is washed with 50 parts of water. After the organic phase has been separated from the aqueous phase, isobutyl ketone is distilled off from the organic phase in order to obtain 79.8 parts of the epoxy resin having an epoxide equivalent of 298 and a softening point of 72° C. In the epoxy resin, 2.5 mol out of 2.9 mol of the alcoholic OH groups have been epoxidized.

EXAMPLE 9

In a manner analogous to example 7, 100 parts of a bisphenol A type epoxy resin (GT6703, produced by Vantico, softening point 88° C., epoxide equivalent 715, average molecular weight 1 430, n=3.8 on average) are dissolved in a mixture of 170 parts of epichlorohydrin and 116 parts of dimethyl sulphoxide. 14.9 parts of 98.5% NaOH are added at 70° C. to this solution over a period of 100 minutes. After the addition, the reaction is carried out at 70° C. for 3 hours. The main part of the excess of the unreacted epichlorohydrin and of the dimethyl sulphoxide is then distilled off under reduced pressure. The reaction product contaminated with dimethyl sulphoxide and the salt formed as a byproduct are dissolved in 187.5 parts of methyl isobutyl ketone. 1.83 parts of 30% NaOH are added to this solution and reaction is effected at 70° C. for 1 hour. After the reaction, the reaction mixture is washed twice with 50 parts of water. After the organic phase has been separated from the aqueous phase, isobutyl ketone is distilled off from the organic phase in order to obtain 80.5 parts of the epoxy resin having an epoxide equivalent of 303 and a softening point of 79° C. According to a calculation, 3.4 mol out of 3.8 mol of the alcoholic OH groups in the epoxy resin have been epoxidized.

EXAMPLE 10

144 parts of acrylic acid, 1.2 parts of hydroquinone and 329 parts of carbitol acetate are added to 610 parts (2 equivalents) of the resin prepared according to example 7. The mixture is heated to 90° C. while stirring, in order to form a homogeneous solution. The mixture is then cooled to 60° C. and 2 parts of triphenylphosphine are added. The resulting mixture is heated to 100° C. and reacted for about 32 hours in order to obtain a reaction product having an acid value of 1.0 mg KOH/g. 165 g of tetrahydrophthalic anhydride (154 g=1 equivalent) and 168.8 g of carbitol acetate are added to this reaction product and the mixture thus obtained is heated to 95° C. and reacted for about 6 hours. The reaction mixture if then cooled. The photocurable resin thus obtained has a solids content of 65%. The solid component has an acid value of 100 mg KOH/g.

EXAMPLE 11

596 parts (2 equivalents) of the resin prepared according to example 8 are added to 144 parts of acrylic acid, 1.2 parts of hydroquinone and 321 parts of carbitol acetate. The mixture is heated to 90° C. while stirring, in order to form a homogeneous solution. The mixture is cooled to 60° C. and 2 parts of triphenylphosphine are added, and the resulting mixture is heated to 100° C. and reacted for about 32 hours in order to form a reaction product having an acid value of 1.0 mg KOH/g. 161 g of tetrahydrophthalic anhydride (154 g=1 equivalent) and 135 g of carbitol acetate are added to this reaction product. The mixture thus obtained is heated to 95° C. and reacted for a period of about 6 hours and then cooled. The photocurable resin thus obtained has a solids content of 65%. The solid component has an acid value of 100 mg KOH/g.

EXAMPLE 12

144 parts of acrylic acid, 1.2 parts of hydroquinone and 326 parts of carbitol acetate are added to 606 parts (2 equivalents) of the resin prepared according to example 9. The mixture is heated to 90C while stirring, in order to obtain a homogeneous solution. The mixture is then cooled to 60° C. and 2 parts of triphenylphosphine are added. The mixture thus obtained is heated to 100° C. and reacted for about 32 hours in order to obtain a reaction product having an acid value of 1.0 mg KOH/g. 163.7 g of tetrahydrophthalic anhydride (154 g=1 equivalent) and 137.3 g of carbitol acetate are added to said reaction product. The mixture is heated to 95° C. and reacted for about 6 hours and then cooled. The photocurable resin thus obtained has a solids content of about 65%. The solid component has an acid value of 100 mg KOH/g.

EXAMPLE 13

The resin prepared according to example 7 (epoxide equivalent=305) and a cresol novolak type epoxy resin JDCN-702 (produced by Tohto Kasei AG, epoxide equivalent=215) are mixed together in a ratio of 9:1. 144 parts of acrylic acid, 1.2 parts of hydroquinone and 319 parts of carbitol acetate are added to 592 parts (2 equivalents) of the mixed resin. The mixture is heated to 90° C. while stirring, in order to form a homogeneous solution. The mixture is cooled to 60° C. and 2 parts of triphenylphosphine are added. The resulting mixture is heated to 100° C. and reacted for about 32 hours in order to obtain a reaction product having an acid value of 1.0 mg KOH/g. 160 g of tetrahydrophthalic anhydride (154 9=1 equivalent) and 134.1 g of carbitol acetate are added to said reaction product and the mixture is heated to 95° C., reacted for about 6 hours and then cooled. The photocurable resin thus obtained has a solids content of 65%. The solid component has an acid value of 100 mg KOH/g.

EXAMPLE 14

The resin prepared according to example 8 (epoxide equivalent=298) and a phenol novolak type epoxy resin EPN1138 (produced by Vantico; epoxide equivalent=176) are mixed together in a ratio of 9:1. 144 parts of acrylic acid, 1.2 parts of hydroquinone and 308.3 parts of carbitol acetate are added to 591.6 parts (2 equivalents) of this mixture. The mixture is heated to 90° C. while stirring, in order to form a homogeneous solution. The mixture is cooled to 60° C. and 2 parts of triphenylphosphine are added. The resulting mixture is heated to 100° C. and reacted for about 32 hours in order to obtain a reaction product having an acid value of 1.0 mg KOH/g. 154.5 g of tetrahydrophthalic anhydride (154 g=1 equivalent) and 129.5 parts of carbitol acetate are added to said reaction product and the mixture thus obtained is heated to 95° C. and reacted for about 6 hours and then cooled. The photocurable resin thus obtained has a solids content of 65%. The solid component has an acid value of 100 mg KOH/g.

EXAMPLE 15

The resin prepared according to example 7 and the resin obtained according to example 8 are mixed together in a ratio of 8:2. 144 parts of acrylic acid, 1.2 parts of hydroquinone and 326 parts of carbitol acetate are added to 606 parts (2 equivalents) of the mixed resin. The mixture is heated to 90° C. while stirring, in order to form a homogeneous solution. The mixture is cooled to 60° C. and 2 parts of triphenylphosphine are added. The resulting mixture is heated to 100° C. and reacted for about 32 hours in order to obtain a reaction product having an acid value of 1.0 mg KOH/g. 163.7 g of tetrahydrophthalic anhydride (154 g=1 equivalent) and 137.3 g of carbitol acetate are added to said reaction product. The mixture is heated to 95° C. and reacted for about 6 hours and then cooled. The photocurable resin thus obtained has a solids content of 65%. The solid component has an acid value of 100 mg KOH/g.

EXAMPLE 16

310 parts of a bisphenol F type epoxy resin (epoxide equivalent=898, n=5.8 on average, softening point 81.1° C., viscosity 14.0 dPa·s at 140° C.) are dissolved in a mixture of 90 parts of epichlorohydrin and 470.5 parts of dimethyl sulphoxide. 54.2 parts of a 98.5%. NaOH solution are added to the above solution at 70° C. over a period of 100 minutes, while stirring. The resulting mixture is reacted at 70° C. for 3 hours. The main part of the excess of the unreacted epichlorohydrin and the dimethyl sulphoxide is then distilled off under reduced pressure. The reaction product contaminated with dimethyl sulphoxide and the byproduct formed as a salt are dissolved in 800 parts of methyl isobutyl ketone. 10 parts of a 30% NaOH solution are then added and the reaction is effected at 70° C. for 1 hour. After the reaction, the reaction mixture is washed twice with 200 parts of water and separated into different phases. The methyl isobutyl ketone is removed from the organic phase. 340 parts of the epoxy resin having an epoxide equivalent of 424 and a hydrolysable chlorine content of 0.07% by weight, a softening point of 64.2° C. and a solution viscosity of 7.1 dPa·s are obtained thereby. In this epoxy resin, 5.5 mol out of 5.8 mol of the alcoholic OH groups have been epoxidized. The epoxy resin obtained according to example 16 (424 parts) and 72 parts of acrylic acid are reacted in carbitol acetate under reflux. 76 parts of hexahydrophthalic anhydride are added to the reaction product thus obtained, and the reaction is carried out under reflux until the acid value has reached the theoretical value. The photocurable resin thus obtained contains 70% of solid component.

The compositions are prepared according to the ratios shown in Tables 1-1 to 1-6. The numerical values are stated in % by weight. After an initial brief mixing of the ingredients, each formulation is kneaded twice in a three-roll mill. The size distribution of each formulation is measured using a grindometer (produced by Erichsen Co.). The particles thus obtained are smaller than 16 μm.

The total surface area of a circuit board is coated with the composition according to the invention and dried in an air circulation oven at 80° C. for 20 minutes. After drying, the layer thus obtained is exposed to light, developed and finally cured by heat in order to obtain the solder resist pattern.

TABLE 1-1

| Example No. | 1 | 2 | 3 | 4 | 5 | 6 | 7 | 8 |
|---|---|---|---|---|---|---|---|---|
| Elastomer acc. to example 1 | 5.0 | 5.0 | 5.0 | 5.0 | 5.0 | 5.0 | 5.0 | 5.0 |
| Resin according to example 2 | 45.0 | — | — | — | — | — | — | — |
| Resin according to example 3 | — | 45.0 | — | — | — | — | — | — |
| Resin according to example 4 | — | — | 45.0 | — | — | — | — | — |
| Resin according to example 5 | — | — | — | 45.0 | — | — | — | — |
| Resin according to example 6 | — | — | — | — | 45.0 | — | — | — |
| Resin according to example 10 | — | — | — | — | — | 45.0 | — | — |
| Resin according to example 11 | — | — | — | — | — | — | 45.0 | — |
| Resin according to example 12 | — | — | — | — | — | — | — | 45.0 |
| Resin according to example 7 | — | — | — | — | — | 10.0 | — | — |
| Particulate material having a core and shell (silicone core shell) | 3.0 | 3.0 | 3.0 | 3.0 | 3.0 | 3.0 | 3.0 | 3.0 |
| Dipentaerythrityl hexaacrylate | 5.0 | 5.0 | 5.0 | 5.0 | 5.0 | 5.0 | 5.0 | 5.0 |
| Irgacure 907 ® | 2.0 | 2.0 | 2.0 | 2.0 | 2.0 | 2.0 | 2.0 | 2.0 |
| Irgacure 369 ® | 3.0 | 3.0 | 3.0 | 3.0 | 3.0 | 3.0 | 3.0 | 3.0 |
| Kayacure DETX-S ® | 0.05 | 0.05 | 0.05 | 0.05 | 0.05 | 0.05 | 0.05 | 0.05 |
| Kayacure BMS ® | 1.0 | 1.0 | 1.0 | 1.0 | 1.0 | 1.0 | 1.0 | 1.0 |
| Kayacure EPA ® | 0.2 | 0.2 | 0.2 | 0.2 | 0.2 | 0.2 | 0.2 | 0.2 |
| Dicyandiamide | 1.0 | 1.0 | 1.0 | 1.0 | 1.0 | 1.0 | 1.0 | 1.0 |
| Trimethylolpropane triacrylate | 2.0 | 2.0 | 2.0 | 2.0 | 2.0 | 2.0 | 2.0 | 2.0 |
| Barium sulphate | 15.0 | 15.0 | 15.0 | 15.0 | 15.0 | 15.0 | 15.0 | 15.0 |
| Finely granulated talc | 1.5 | 1.5 | 1.5 | 1.5 | 1.5 | 1.5 | 1.5 | 1.5 |
| Aerosil #200 ® | 1.0 | 1.0 | 1.0 | 1.0 | 1.0 | 1.0 | 1.0 | 1.0 |
| Flowlen AC-303 ® | 1.0 | 1.0 | 1.0 | 1.0 | 1.0 | 1.0 | 1.0 | 1.0 |
| Silicone antifoam | — | — | — | — | — | — | — | — |
| Mercaptotriazole | 0.5 | 0.5 | 0.5 | 0.5 | 0.5 | 0.5 | 0.5 | 0.5 |
| Silane coupling agent | 0.5 | 0.5 | 0.5 | 0.5 | 0.5 | 0.5 | 0.5 | 0.5 |
| Solvesso #150 ® | 3.0 | 3.0 | 3.0 | 3.0 | 3.0 | 3.0 | 3.0 | 3.0 |
| Phthalocyanine Grün ® | 0.5 | 0.5 | 0.5 | 0.5 | 0.5 | 0.5 | 0.5 | 0.5 |
| Heliogen Blau L7560 ® | — | — | — | — | — | — | — | — |
| Irga Hellblau GS ® | — | — | — | — | — | — | — | — |
| TEPIC-S ® | — | — | — | 10.0 | 10.0 | — | — | 10.0 |
| YX-4000 ® | 10.0 | 10.0 | 10.0 | — | — | — | 10.0 | — |

TABLE 1-2

| Example No. | 9 | 10 | 11 | 12 | 13 | 14 | 15 | 16 |
|---|---|---|---|---|---|---|---|---|
| Elastomer acc. to example 1 | 5.0 | 5.0 | 5.0 | 5.0 | 5.0 | 5.0 | 5.0 | 5.0 |
| Resin according to example 10 | — | — | — | — | 30.0 | — | 30.0 | — |
| Resin according to example 11 | — | — | — | — | — | — | — | — |
| Resin according to example 12 | — | — | — | — | — | — | — | — |
| Resin according to example 13 | 45.0 | — | — | — | — | 30.0 | — | 30.0 |
| Resin according to example 14 | — | 45.0 | — | — | — | — | — | — |
| Resin according to example 15 | — | — | 45.0 | — | — | — | — | — |
| Resin according to example 2 | — | — | — | 15.0 | 15.0 | 15.0 | — | — |
| Resin according to example 3 | — | — | — | — | — | — | — | — |
| Resin according to example 4 | — | — | — | — | — | — | — | — |
| Resin according to example 5 | — | — | — | 30.0 | — | — | 15.0 | 15.0 |
| Resin according to example 6 | — | — | — | — | — | — | — | — |
| Particulate material having a core and shell (silicone core shell) | 3.0 | 3.0 | 3.0 | 3.0 | 3.0 | 3.0 | 3.0 | 3.0 |
| Dipentaerythrityl hexaacrylate | 5.0 | 5.0 | 5.0 | 5.0 | 5.0 | 5.0 | 5.0 | 5.0 |
| Irgacure 907 ® | 2.0 | 2.0 | 2.0 | 2.0 | 2.0 | 2.0 | 2.0 | 2.0 |
| Irgacure 369 ® | 3.0 | 3.0 | 3.0 | 3.0 | 3.0 | 3.0 | 3.0 | 3.0 |
| Kayacure DETX-S ® | 0.05 | 0.05 | 0.05 | 0.05 | 0.05 | 0.05 | 0.05 | 0.05 |
| Kayacure BMS ® | 1.0 | 1.0 | 1.0 | 1.0 | 1.0 | 1.0 | 1.0 | 1.0 |
| Kayacure EPA ® | 0.2 | 0.2 | 0.2 | 0.2 | 0.2 | 0.2 | 0.2 | 0.2 |
| Dicyandiamide | 1.0 | 1.0 | 1.0 | 1.0 | 1.0 | 1.0 | 1.0 | 1.0 |
| Trimethylolpropane triacrylate | 2.0 | 2.0 | 2.0 | 2.0 | 2.0 | 2.0 | 2.0 | 2.0 |
| Barium sulphate | 15.0 | 15.0 | 15.0 | 15.0 | 15.0 | 15.0 | 15.0 | 15.0 |
| Finely granulated talc | 1.5 | 1.5 | 1.5 | 1.5 | 1.5 | 1.5 | 1.5 | 1.5 |
| Aerosil #200 ® | 1.0 | 1.0 | 1.0 | 1.0 | 1.0 | 1.0 | 1.0 | 1.0 |
| Flowlen AC-303 ® | 1.0 | 1.0 | 1.0 | 1.0 | 1.0 | 1.0 | 1.0 | 1.0 |
| Silicone antifoam | — | — | — | — | — | — | — | — |
| Mercaptotriazole | 0.5 | 0.5 | 0.5 | 0.5 | 0.5 | 0.5 | 0.5 | 0.5 |
| Silane coupling agent | 0.5 | 0.5 | 0.5 | 0.5 | 0.5 | 0.5 | 0.5 | 0.5 |
| Solvesso #150 ® | 3.0 | 3.0 | 3.0 | 3.0 | 3.0 | 3.0 | 3.0 | 3.0 |
| Phthalocyanine Grün ® | 0.5 | 0.5 | 0.5 | 0.5 | 0.5 | 0.5 | 0.5 | 0.5 |
| Heliogen Blau L7560 ® | — | — | — | — | — | — | — | — |
| Irga Hellblau GS ® | — | — | — | — | — | — | — | — |
| TEPIC-S ® | — | — | — | 10.0 | 10.0 | — | — | 10.0 |
| YX-4000 ® | 10.0 | 10.0 | 10.0 | — | — | — | 10.0 | — |

TABLE 1-3

| Example No. | 17 | 18 | 19 | 20 | 21 | 22 | 23 | 24 |
|---|---|---|---|---|---|---|---|---|
| Elastomer acc. to example 1 | 5.0 | 5.0 | 5.0 | 5.0 | 5.0 | 5.0 | 5.0 | 5.0 |
| Resin according to example 2 | — | 10.0 | 10.0 | 10.0 | — | — | — | — |
| Resin according to example 3 | — | — | — | — | — | — | — | — |
| Resin according to example 4 | — | — | — | — | — | — | — | — |
| Resin according to example 5 | — | 10.0 | — | 10.0 | 10.0 | 10.0 | 10.0 | 10.0 |
| Resin according to example 6 | — | — | — | — | — | — | — | — |
| Resin according to example 10 | 25.0 | 25.0 | 25.0 | — | 20.0 | 25.0 | — | — |
| Resin according to example 11 | — | — | — | — | — | — | 25.0 | — |
| Resin according to example 12 | — | — | — | — | — | — | — | 25.0 |
| Resin according to example 13 | 20.0 | — | 10.0 | 25.0 | 15.0 | 10.0 | — | 10.0 |
| Resin according to example 14 | — | — | — | — | — | — | — | — |
| Resin according to example 15 | — | — | — | — | — | — | — | — |
| Particulate material having a core and shell (silicone core shell) | 3.0 | 3.0 | 3.0 | 3.0 | 3.0 | 3.0 | 3.0 | 3.0 |
| Dipentaerythrityl hexaacrylate | 5.0 | 5.0 | 5.0 | 5.0 | 5.0 | 5.0 | 5.0 | 5.0 |
| Irgacure 907 ® | 2.0 | 2.0 | 2.0 | 2.0 | 2.0 | 2.0 | 2.0 | 2.0 |
| Irgacure 369 ® | 3.0 | 3.0 | 3.0 | 3.0 | 3.0 | 3.0 | 3.0 | 3.0 |
| Kayacure DETX-S ® | 0.05 | 0.05 | 0.05 | 0.05 | 0.05 | 0.05 | 0.05 | 0.05 |
| Kayacure BMS ® | 1.0 | 1.0 | 1.0 | 1.0 | 1.0 | 1.0 | 1.0 | 1.0 |
| Kayacure EPA ® | 0.2 | 0.2 | 0.2 | 0.2 | 0.2 | 0.2 | 0.2 | 0.2 |
| Dicyandiamide | 1.0 | 1.0 | 1.0 | 1.0 | 1.0 | 1.0 | 1.0 | 1.0 |
| Trimethylolpropane triacrylate | 2.0 | 2.0 | 2.0 | 2.0 | 2.0 | 2.0 | 2.0 | 2.0 |
| Barium sulphate | 15.0 | 15.0 | 15.0 | 15.0 | 15.0 | 15.0 | 15.0 | 15.0 |
| Finely granulated talc | 1.5 | 1.5 | 1.5 | 1.5 | 1.5 | 1.5 | 1.5 | 1.5 |
| Aerosil #200 ® | 1.0 | 1.0 | 1.0 | 1.0 | 1.0 | 1.0 | 1.0 | 1.0 |
| Flowlen AC-303 ® | 1.0 | 1.0 | 1.0 | 1.0 | 1.0 | 1.0 | 1.0 | 1.0 |
| Silicone antifoam | — | — | — | — | — | — | — | — |
| Mercaptotriazole | 0.5 | 0.5 | 0.5 | 0.5 | 0.5 | 0.5 | 0.5 | 0.5 |
| Silane coupling agent | 0.5 | 0.5 | 0.5 | 0.5 | 0.5 | 0.5 | 0.5 | 0.5 |
| Solvessa #150 ® | 3.0 | 3.0 | 3.0 | 3.0 | 3.0 | 3.0 | 3.0 | 3.0 |
| Phthalocyanine Grün ® | 0.5 | 0.5 | 0.5 | 0.5 | 0.5 | 0.5 | 0.5 | 0.5 |
| Heliogen Blau L7560 ® | — | — | — | — | — | — | — | — |

TABLE 1-3-continued

| Example No. | 17 | 18 | 19 | 20 | 21 | 22 | 23 | 24 |
|---|---|---|---|---|---|---|---|---|
| Irga Hellblau GS ® | — | — | — | — | — | — | — | — |
| TEPIC-S ® | — | — | — | 10.0 | 10.0 | — | — | 10.0 |
| YX-4000 ® | 10.0 | 10.0 | 10.0 | — | — | — | 10.0 | — |

TABLE 1-4

| Comparative example no. | 1 | 2 | 3 | 4 | 5 | 6 | 7 | 8 |
|---|---|---|---|---|---|---|---|---|
| Resin according to example 2 | 45.0 | — | — | — | — | — | — | — |
| Resin according to example 3 | — | 45.0 | — | — | — | — | — | — |
| Resin according to example 4 | — | — | 45.0 | — | — | — | — | — |
| Resin according to example 5 | — | — | — | 45.0 | — | — | — | — |
| Resin according to example 6 | — | — | — | — | 45.0 | — | — | — |
| Resin according to example 10 | — | — | — | — | — | 45.0 | — | — |
| Resin according to example 11 | — | — | — | — | — | — | 45.0 | — |
| Resin according to example 12 | — | — | — | — | — | — | — | 45.0 |
| Dipentaerythrityl hexaacrylate | 5.0 | 5.0 | 5.0 | 5.0 | 5.0 | 5.0 | 5.0 | 5.0 |
| Irgacure 907 ® | 2.0 | 2.0 | 2.0 | 2.0 | 2.0 | 2.0 | 2.0 | 2.0 |
| Irgacure 369 ® | 3.0 | 3.0 | 3.0 | 3.0 | 3.0 | 3.0 | 3.0 | 3.0 |
| Kayacure DETX-S ® | 0.05 | 0.05 | 0.05 | 0.05 | 0.05 | 0.05 | 0.05 | 0.05 |
| Kayacure BMS ® | 1.0 | 1.0 | 1.0 | 1.0 | 1.0 | 1.0 | 1.0 | 1.0 |
| Kayacure EPA ® | 0.2 | 0.2 | 0.2 | 0.2 | 0.2 | 0.2 | 0.2 | 0.2 |
| Dicyandiamide | 1.0 | 1.0 | 1.0 | 1.00 | 1.0 | 1.0 | 1.0 | 1.0 |
| Trimethylolpropane triacrylate | 2.0 | 2.0 | 2.0 | 2.0 | 2.0 | 2.0 | 2.0 | 2.0 |
| Barium sulphate | 15.0 | 15.0 | 15.0 | 15.0 | 15.0 | 15.0 | 15.0 | 15.0 |
| Finely granulated chalk | 1.5 | 1.5 | 1.5 | 1.5 | 1.5 | 1.5 | 1.5 | 1.5 |
| Aerosil #200 ® | 1.0 | 1.0 | 1.0 | 1.0 | 1.0 | 1.0 | 1.0 | 1.0 |
| Flowlen AC-303 ® | 1.0 | 1.0 | 1.0 | 1.0 | 1.0 | 1.0 | 1.0 | 1.0 |
| Silicone antifoam | — | — | — | — | — | — | — | — |
| Mercaptotriazole | 0.5 | 0.5 | 0.5 | 0.5 | 0.5 | 0.5 | 0.5 | 0.5 |
| Silane coupling agent | 0.5 | 0.5 | 0.5 | 0.5 | 0.5 | 0.5 | 0.5 | 0.5 |
| Solvesso #150 ® | 3.0 | 3.0 | 3.0 | 3.0 | 3.0 | 3.0 | 3.0 | 3.0 |
| Phthalocyanine Grün ® | 0.5 | 0.5 | 0.5 | 0.5 | 0.5 | 0.5 | 0.5 | 0.5 |
| Heliogen Blau L7560 ® | — | — | — | — | — | — | — | — |
| Irga Light Gelb GS ® | — | — | — | — | — | — | — | — |
| TEPIC-S ® | — | — | — | 10.0 | 10.0 | — | — | 10.0 |
| YX-4000 ® | 10.0 | 10.0 | 10.0 | — | — | — | 10.0 | — |

TABLE 1-5

| Comparative example no. | 9 | 10 | 11 | 12 | 13 | 14 | 15 | 16 |
|---|---|---|---|---|---|---|---|---|
| Resin according to example 10 | — | — | — | — | 30.0 | — | 30.0 | — |
| Resin according to example 13 | 45.0 | — | — | — | — | 30.0 | — | 30.0 |
| Resin according to example 14 | — | 45.0 | — | — | — | — | — | — |
| Resin according to example 15 | — | — | 45.0 | — | — | — | — | — |
| Resin according to example 2 | — | — | — | 15.0 | 15.0 | 15.0 | — | — |
| Resin according to example 5 | — | — | — | 30.0 | — | — | 15.0 | 15.0 |
| Dipentaerythrityl hexaacrylate | 5.0 | 5.0 | 5.0 | 5.0 | 5.0 | 5.0 | 5.0 | 5.0 |
| Irgacure 907 ® | 2.0 | 2.0 | 2.0 | 2.0 | 2.0 | 2.0 | 2.0 | 2.0 |
| Irgacure 369 ® | 3.0 | 3.0 | 3.0 | 3.0 | 3.0 | 3.0 | 3.0 | 3.0 |
| Kayacure DETX-S ® | 0.05 | 0.05 | 0.05 | 0.05 | 0.05 | 0.05 | 0.05 | 0.05 |
| Kayacure BMS ® | 1.0 | 1.0 | 1.0 | 1.0 | 1.0 | 1.0 | 1.0 | 1.0 |
| Kayacure EPA ® | 0.2 | 0.2 | 0.2 | 0.2 | 0.2 | 0.2 | 0.2 | 0.2 |
| Dicyandiamide | 1.0 | 1.0 | 1.0 | 1.0 | 1.0 | 1.0 | 1.0 | 1.0 |
| Trimethylolpropane triacrylate | 2.0 | 2.0 | 2.0 | 2.0 | 2.0 | 2.0 | 2.0 | 2.0 |
| Barium sulphate | 15.0 | 15.0 | 15.0 | 15.0 | 15.0 | 15.0 | 15.0 | 15.0 |
| Finely granulated talc | 1.5 | 1.5 | 1.5 | 1.5 | 1.5 | 1.5 | 1.5 | 1.5 |
| Aerosil #200 ® | 1.0 | 1.0 | 1.0 | 1.0 | 1.0 | 1.0 | 1.0 | 1.0 |
| Silicone antifoam | — | — | — | — | — | — | — | — |
| Mercaptotriazole | 0.5 | 0.5 | 0.5 | 0.5 | 0.5 | 0.5 | 0.5 | 0.5 |
| Silane coupling agent | 0.5 | 0.5 | 0.5 | 0.5 | 0.5 | 0.5 | 0.5 | 0.5 |
| Solvesso #150 ® | 3.0 | 3.0 | 3.0 | 3.0 | 3.0 | 3.0 | 3.0 | 3.0 |
| Phthalocyanine Grün ® | 0.5 | 0.5 | 0.5 | 0.5 | 0.5 | 0.5 | 0.5 | 0.5 |
| Heliogen Blau L7560 ® | — | — | — | — | — | — | — | — |
| Irga Hellblau GS ® | — | — | — | — | — | — | — | — |
| TEPIC-S ® | — | — | — | 10.0 | 10.0 | — | — | 10.0 |
| YX-4000 ® | 10.0 | 10.0 | 10.0 | — | — | — | 10.0 | — |

TABLE 1-6

| Comparative example no. | 17 | 18 | 19 | 20 | 21 | 22 | 23 | 24 |
|---|---|---|---|---|---|---|---|---|
| Resin according to example 2 | — | — | — | 10.0 | — | — | — | — |
| Resin according to example 5 | 25.0 | 45.0 | — | 10.0 | 10.0 | 10.0 | 10.0 | 10.0 |
| Resin according to example 10 | — | — | 45.0 | — | 20.0 | 25.0 | — | — |
| Resin according to example 11 | — | — | — | — | — | — | 25.0 | — |
| Resin according to example 12 | — | — | — | — | — | — | — | 25.0 |
| Resin according to example 13 | 20.0 | — | — | 25.0 | 15.0 | 10.0 | 10.0 | 10.0 |
| Rubber particles | 8.0 | 8.0 | 8.0 | — | — | — | — | — |
| Dipentaerythrityl hexaacrylate | 5.0 | 5.0 | 5.0 | 5.0 | 5.0 | 5.0 | 5.0 | 5.0 |
| Irgacure 907 ® | 2.0 | 2.0 | 2.0 | 2.0 | 2.0 | 2.0 | 2.0 | 2.0 |
| Irgacure 369 ® | 3.0 | 3.0 | 3.0 | 3.0 | 3.0 | 3.0 | 3.0 | 3.0 |
| Kayacure DETX-S ® | 0.05 | 0.05 | 0.05 | 0.05 | 0.05 | 0.05 | 0.05 | 0.05 |
| Kayacure BMS ® | 1.0 | 1.0 | 1.0 | 1.0 | 1.0 | 1.0 | 1.0 | 1.0 |
| Kayacure EPA ® | 0.2 | 0.2 | 0.2 | 0.2 | 0.2 | 0.2 | 0.2 | 0.2 |
| Dicyandiamide | 1.0 | 1.0 | 1.0 | 1.0 | 1.0 | 1.0 | 1.0 | 1.0 |
| Trimethylolpropane triacrylate | 2.0 | 2.0 | 2.0 | 2.0 | 2.0 | 2.0 | 2.0 | 2.0 |
| Barium sulphate | 15.0 | 15.0 | 15.0 | 15.0 | 15.0 | 15.0 | 15.0 | 15.0 |
| Finely granulated talc | 1.5 | 1.5 | 1.5 | 1.5 | 1.5 | 1.5 | 1.5 | 1.5 |
| Aerosil #200 ® | 1.0 | 1.0 | 1.0 | 1.0 | 1.0 | 1.0 | 1.0 | 1.0 |
| Flowlen AC-303 ® | 1.0 | 1.0 | 1.0 | 1.0 | 1.0 | 1.0 | 1.0 | 1.0 |
| Silicone antifoam | — | — | — | — | — | — | — | — |
| Mercaptotriazole | 0.5 | 0.5 | 0.5 | 0.5 | 0.5 | 0.5 | 0.5 | 0.5 |
| Silane coupling agent | 0.5 | 0.5 | 0.5 | 0.5 | 0.5 | 0.5 | 0.5 | 0.5 |
| Solvesso #150 ® | 3.0 | 3.0 | 3.0 | 3.0 | 3.0 | 3.0 | 3.0 | 3.0 |
| Phthalocyanine Grün ® | 0.5 | 0.5 | 0.5 | 0.5 | 0.5 | 0.5 | 0.5 | 0.5 |
| Heliogen Blau L7560 ® | — | — | — | — | — | — | — | — |
| Irga Hellblau GS ® | — | — | — | — | — | — | — | — |
| TEPIC-S ® | — | — | — | 10.0 | 10.0 | — | — | 10.0 |
| YX-4000 ® | 10.0 | 10.0 | 10.0 | — | — | — | 10.0 | — |

Flexibility Test

Each formulation is exposed through a photomask to ultraviolet light at a wavelength of 365 nm and in a dose of 200-400 mJ/cm² (measured using an integral actinometer produced by Oak Seisakusho AG). The development is carried out with a weakly aqueous alkaline developing solution for 60 seconds under a spray pressure of 2 kg/cm². The pattern thus obtained is based in an Erichsen tester and treated by the method described in JIS/K5400. A steel ball is pressed against the back of the test board (hardened film of a cured resin on a surface of a steel plate) in order to deform the test plate. The pressure distance required to form a tear and to detach the film is measured.

Resistance to Hot/Cold Cycles

Each formulation is exposed through a photomask to ultraviolet light at a wavelength of 365 nm and in a dose of 200-400 mJ/cm² (measured using an integral actinometer produced by Oak Seisakusho AG). The development is carried out with a weakly aqueous alkaline developing solution for 60 seconds under a spray pressure of 2 kg/cm². The developed test board is placed in an apparatus for temperature change. The temperature is changed alternately from −55° C. to 125° C., the temperature being maintained in each case for 15 minutes. The term cycle is used when the temperature change from −55° C. to 125° C. (or back) is complete. The formation of new tears is checked after 50 cycles. If a tear is found, the test is terminated.

Moisture Resistance

Exposure is effected through a photomask to ultraviolet light at a wavelength of 365 μm in a dose of 200-400 mJ/cm² (measured using an integral actinometer produced by Oak Seisakusho AG) and the sample thus exposed is used as a test board. Comparative pieces are produced by exposing a sample at a dose of 200-750 mJ/cm². The test board is developed in a weakly aqueous alkaline developing solution for 60 seconds under a spray pressure of 2 kg/cm². The developed test board is stored in a pressure cooker for 200 hours at a temperature of 121° C. under a pressure of 2 atmospheres and a humidity of 100%. Thereafter, the condition of the protective film is checked visually and the results are assessed according to the following criteria:
Q: no change observable
R: a slight change on the surface is observable
S: a substantial change on the surface is observable
T: the protective film is torn off.

Tack/Dryness

The composition is applied to a test board and dried at 80° C. for 20 minutes in a hot air circulation oven. A finger is then pressed vigorously into the surface in order to investigate the state of the adhesion. The result is assessed according to the following criteria:
Q: neither tack nor fingerprint observable
R: slight tack and a fingerprint observable on the surface
S: considerable tack and fingerprint observable on the surface
T: the coating is very tacky.

Photosensitivity Test

Each test board is exposed to ultraviolet light at a wavelength of 365 nm and in a dose of 300 mJ/cm², 400 mJ/cm² and 450 mJ/cm² (measured using an integral actinometer (Oak Seisakosho AG)). After the development with a weakly alkaline aqueous solution for 60 seconds under a gentle spray pressure of 2 kg/cm², the state of the film-thus formed is checked visually and assessed according to the following criteria:
Q: no change observable
R: slight change observable
S: slight change of surface observable
T: the film is torn off.

Development Test

The test board is prepared by exposure of the coated test board through a photomask to ultraviolet light having a wavelength of 365 nm and in a dose of 200-400 mJ/cm² (measured using an integral actinometer (Oak Seisakosho AG)). In the comparative examples, exposure is effected using a dose of 200-750 mJ/cm². The development is carried out in a weakly alkaline aqueous solution under a spray pressure of 2 kg/cm² for a period of 20, 40 or 60 seconds. After the development, the removal of the unexposed layer is checked visually and assessed according to the following criteria:
Q: complete development was achieved
R: a thin layer of undeveloped material remains on the surface
S: undeveloped material is distributed over the entire test board
T: scarcely any development was achieved.

Adhesion Test (According to DIN 53151)

The test board is exposed through a photomask to ultraviolet light at a wavelength of 365 nm and in a dose of 200-400 mJ/cm² (measured using an integral actinometer (Oak Seisakosho AG)). In the comparative examples, exposure is effected at a dose of from 200 to 750 mJ/cm². The development is carried out with a weakly alkaline aqueous solution under a spray pressure of 2 kg/cm² for a period of 60 seconds. The developed test boards are postcured under various conditions. Each test board thus obtained is subjected to a crosshatch test and subjected to a peel test with a cellophane adhesive tape. The test boards are then checked visually and the result is assessed according to the following criteria:
Q: 100/100 no peeling observable
R: 100/100 slight peeling in the crosshatch lines
S: 50/100 to 90/100 moderate adhesion
T: 0/100 to 50/100 weak adhesion.

Pencil Hardness Test

The same test board used in the adhesion test is subjected to a hardness test by the method of JISK5400 under a load of 1 kg.

Acid Resistance Test

The same test board which is used in the adhesion test is placed in a 10% (V/N) aqueous sulphuric acid solution at 20° C. for 30 minutes. The acid resistance is assessed on the basis of the peeling and of the adhesion:
Q: no change observable
R: slight change observable
S: considerable change observable
T: swelling of the film or falling off of the film as a result of swelling observable.

Alkali Resistance Test

The test and the assessment are carried out analogously to the acid resistance test, except that the aqueous sulphuric acid solution is replaced by a 10% by weight aqueous NaOH solution.

Solvent Resistance Test

The test and the assessment are carried out analogously to the acid resistance test, except that the aqueous sulphuric acid is replaced by acetone.

Metallization Stability Test

The plating solution used is Aotolonex Cl (plating solution produced by Cellex Corp. USA). The test board used is the same as that used in the adhesion test. This is metallized for 9 minutes at a liquid temperature of 30° C. and a current density of 1 A/dm², in order to apply gold in a thickness of 1.5 µm. The condition of the film is assessed under the same criteria as for the acid resistance test.

Solder Resistance Test

According to the test methods described in JISC6481, the test board used in the adhesion test is immersed for 10 seconds in a solder bath at 260° C. (once on one side and three times on the other side). The condition of the film is then checked according to the same criteria as in the acid resistance test.

Solbond K183 Resistance Test

According to a test method described in JISC6481, the test plate described in the case of the adhesion test is immersed for 10 seconds in a solder bath at 260° C. (once on one side and three times on the other side). The condition of the film is then assessed according to the same criteria as in the acid resistance test, K 183 (product of α-Metall Co.) being used as a flux.

Insulation Resistance Test

Using the comb-like test pattern B of IPC-B-25, a test board is prepared under the same conditions as in the adhesion test. According to the test methods described in IPC-SH-840B, the insulation resistance under normal conditions and the insulation resistance in the case of temperature cycles of 25-65° C., relative humidity of 90% at a DC voltage of 100 volt for 7 days are measured.

Insulation Resistance Under Humid Conditions

Using the comb-like test pattern B of IPC-B-25, a test board is prepared under the same conditions as in the adhesion test. The insulation conditions are measured at a temperature of 25° C., a relative humidity of 92% and a DC voltage of 50 volt in an oven.

Resolution

The test board is prepared by exposing the pattern through a photomask to ultraviolet light at a wavelength of 365 nm (line/space ratio of from 25 µm to 300 µm) at a dose of 200-400 mJ/cm², measured using an integral actinometer (Oak Seisakosho AG). The test board of the comparative example is prepared by exposure to ultraviolet light at a dose of 200-750 mJ/cm². After development in a weakly alkaline aqueous solution under a spray pressure of 2 kg/cm² for 60 seconds, the remaining lines in the exposed part are checked visually.

Water Absorption

The test board is prepared by exposing a sample through a photomask to ultraviolet light at a wavelength of 365 nm in a dose of 200-400 mJ/cm² (measured using an integral actinometer (Oak Seisakosho AG)). The test board of the comparative example is prepared by exposure to ultraviolet light in a dose of 200-750 mJ/cm².

After development in a weakly alkaline aqueous solution under a spray pressure of 2 kg/cm² for 60 seconds, the test board thus obtained is postcured at 150° C. for 60 minutes. A ceramic test board is prepared under the same conditions as in the adhesion test. The test board is stored at 85° C. and a relative humidity of 90% for 120 hours, and the changes in the water absorption are then measured.

Sensitivity

A film of a sample is exposed to ultraviolet light at a wavelength of 365 nm and in a dose of 200-400 mJ/cm² (measured using an integral actinometer (Oak Seisakosho AG)) and then developed in a weakly alkaline aqueous solution under a spray pressure of 2 kg/cm² for 60 seconds. After the development, the film is checked visually. The photomask used is a Step-Tablet, produced by Stoffer Co. In the case of the test boards thus obtained, the tack/dryness after drying, the photosensitivity, the developability (condition of the film after development), flexibility after final curing, cold/hot stability, adhesion, hardness of the film, acid resistance, alkali resistance, solvent resistance, metallization stability, solder heat resistance, flux resistance, insulation resistance, insulation resistance under humid conditions, resolution, water absorption and sensitivity are assessed.

The results are summarized in Tables 2-1 to 2-6. The test boards of the comparative example are exposed at 750 mJ/cm$^2$ since the surface of the resist was damaged and the characteristic properties cannot be compared with those exposed at 300 mJ/cm$^2$.

Comparison of the characteristic properties

TABLE 2-1

| Example No. | 1 | 2 | 3 | 4 | 5 | 6 | 7 | 8 |
|---|---|---|---|---|---|---|---|---|
| Flexibility 2.0 | 1.8 | 2.5 | 5.0 | 5.4 | 5.8 | 7.6 | 7.4 | |
| Cold/hot cycle resistance (−55-125° C.) 15 minutes | 126 | 130 | 135 | 1000 | 1000 | 1500 | 1600 | 1800 |
| Moisture resistance | S | S | S | R | R | Q | Q | Q |
| Tack-dryness | Q | Q | Q | R | S | R | R | Q |
| Photosensitivity | Q | Q | Q | Q | Q | Q | S | Q |
| Developability | Q | Q | R | R | R | Q | Q | S |
| Adhesion | Q | Q | R | R | Q | Q | Q | Q |
| Pencil hardness | 6 H | 6 H | 6 H | 5 H | 4 H | 5 H | 5 H | 5 H |
| Acid resistance | Q | Q | Q | Q | Q | Q | Q | Q |
| Alkali resistance | Q | Q | Q | Q | Q | Q | Q | Q |
| Solvent resistance | Q | Q | Q | Q | R | R | R | R |
| Metallization stability | Q | Q | Q | Q | Q | Q | Q | Q |
| Solder resistance | Q | Q | Q | Q | Q | Q | Q | Q |
| KENKO resistance | Q | Q | Q | Q | Q | Q | Q | Q |
| Insulation resistance (humid conditions) × 10$^{12}$ Ω | 5.0 | 6.5 | 7.5 | 5.0 | 4.0 | 9.0 | 8.5 | 8.5 |
| Insulation resistance under humid conditions (measured in moisture) | 10$^8$ | 10$^8$ | 10$^8$ | 10$^8$ | 10$^8$ | 10$^9$ | 10$^9$ | 10$^9$ |
| Resolution L/S | 25/75 | 25/75 | 25/75 | 25/75 | 25/50 | 25/50 | 25/25 | 25/25 |
| Water absorption | 0.5 | 0.6 | 0.7 | 1.2 | 1.3 | 1.2 | 1.2 | 1.2 |

TABLE 2-2

| Example No. | 9 | 10 | 11 | 12 | 13 | 14 | 15 | 16 |
|---|---|---|---|---|---|---|---|---|
| Flexibility 7.0 | 7.0 | 7.0 | 4.0 | 4.0 | 4.0 | 6.0 | 6.0 | |
| Cold/hot cycle resistance (−55-125° C.) 15 minutes | 1800 | 1800 | 1800 | 350 | 500 | 400 | 1600 | 1800 |
| Moisture resistance | Q | Q | Q | R | R | R | Q | Q |
| Tack-dryness | Q | Q | Q | Q | Q | Q | Q | Q |
| Photosensitivity | R | Q | Q | Q | Q | Q | Q | Q |
| Developability | Q | Q | Q | Q | Q | Q | Q | Q |
| Adhesion | Q | Q | Q | Q | Q | Q | Q | Q |
| Pencil hardness | 5 H | 5 H | 5 H | 6 H | 6 H | 6 H | 5 H | 5 H |
| Acid resistance | Q | Q | Q | Q | Q | Q | Q | Q |
| Alkali resistance | Q | Q | Q | Q | Q | Q | Q | Q |
| Solvent resistance | Q | Q | Q | Q | Q | Q | Q | Q |
| Metallization stability | Q | Q | Q | Q | Q | Q | Q | Q |
| Solder resistance | Q | Q | Q | Q | Q | Q | Q | Q |
| KENKO resistance | Q | Q | Q | Q | Q | Q | Q | Q |
| Insulation resistance (humid conditions) × 10$^{12}$ Ω | 9.5 | 8.0 | 9.0 | 6.5 | 7.0 | 7.5 | 8.0 | 9.0 |
| Insulation resistance under humid conditions (measured in moisture) | 10$^9$ | 10$^9$ | 10$^9$ | 10$^8$ | 10$^8$ | 10$^8$ | 10$^8$ | 10$^8$ |
| Resolution L/S | 25/25 | 25/25 | 25/50 | 25/75 | 25/50 | 25/75 | 25/50 | 25/50 |
| Water absorption | 1.2 | 1.3 | 1.2 | 0.9 | 1.0 | 0.8 | 1.4 | 1.5 |

TABLE 2-3

| Example No. | 17 | 18 | 19 | 20 | 21 | 22 | 23 | 24 |
|---|---|---|---|---|---|---|---|---|
| Flexibility 7.0 | 7.0 | 5.0 | 4.5 | 5.0 | 7.0 | 7.0 | 7.0 | |
| Cold/hot cycle resistance (−55-125° C.) 15 minutes | 2000 | 2000 | 400 | 450 | 400 | 1600 | 1800 | 2000 |
| Moisture resistance | Q | Q | R | R | R | Q | Q | Q |
| Tack-dryness | Q | Q | Q | Q | Q | Q | Q | Q |
| Photosensitivity | R | Q | Q | Q | Q | Q | Q | Q |
| Developability | Q | Q | Q | Q | Q | Q | Q | Q |
| Adhesion | Q | Q | Q | Q | Q | Q | Q | Q |
| Pencil hardness | 5 H | 5 H | 6 H | 6 H | 5 H | 5 H | 5 H | 5 H |
| Acid resistance | Q | Q | Q | Q | Q | Q | Q | Q |

TABLE 2-3-continued

| Example No. | 17 | 18 | 19 | 20 | 21 | 22 | 23 | 24 |
|---|---|---|---|---|---|---|---|---|
| Alkali resistance | Q | Q | Q | Q | Q | Q | Q | Q |
| Solvent resistance | Q | Q | Q | Q | Q | Q | Q | Q |
| Metallization stability | Q | Q | Q | Q | Q | Q | Q | Q |
| Solder resistance | Q | Q | Q | Q | Q | Q | Q | Q |
| Flux resistance | Q | Q | Q | Q | Q | Q | Q | Q |
| Insulation resistance (humid conditions) × $10^{12}$ Ω | 7.5 | 8.0 | 5.0 | 6.0 | 5.0 | 6.5 | 7.0 | 8.0 |
| Insulation resistance under humid conditions (measured in moisture) | $10^9$ | $10^9$ | $10^8$ | $10^8$ | $10^9$ | $10^9$ | $10^9$ | $10^9$ |
| Resolution L/S | 25/50 | 25/50 | 25/75 | 25/50 | 25/75 | 25/50 | 25/50 | 25/50 |
| Water absorption | 1.3 | 1.2 | 1.0 | 0.8 | 1.0 | 1.2 | 1.3 | 1.2 |

TABLE 2-4

| Comparative example No. | 1 | 2 | 3 | 4 | 5 | 6 | 7 | 8 |
|---|---|---|---|---|---|---|---|---|
| Flexibility 0.9 | 0.95 | 0.8 | 1.2 | 1.3 | 6.0 | 6.5 | 6.0 | |
| Cold/hot cycle resistance (−55-125° C.) 15 minutes | 60 | 66 | 65 | 100 | 110 | 600 | 300 | 400 |
| Moisture resistance | S | S | S | S | S | R | R | R |
| Tack-dryness | Q | Q | Q | R | S | Q | R | Q |
| Photosensitivity | Q | Q | Q | R | S | R | R | Q |
| Developability | S | S | S | R | R | R | Q | S |
| Adhesion | R | R | R | R | R | R | R | R |
| Pencil hardness | 6 H | 6 H | 6 H | 6 H | 6 H | 6 H | 6 H | 6 H |
| Acid resistance | R | R | R | R | R | R | R | R |
| Alkali resistance | R | R | R | R | R | R | R | R |
| Solvent resistance | R | R | R | R | S | R | S | R |
| Metallization stability | R | R | R | R | R | R | R | R |
| Solder resistance | R | R | R | R | R | R | R | R |
| Flux resistance | R | R | R | S | T | R | R | R |
| Insulation resistance (humid conditions) × $10^{12}$ Ω | 8.2 | 8.4 | 8.3 | 7.2 | 6.5 | 6.5 | 6.7 | 7.4 |
| Insulation resistance under humid conditions (measured in moisture) | $10^8$ | $10^8$ | $10^8$ | $10^8$ | $10^8$ | $10^9$ | $10^9$ | $10^9$ |
| Resolution L/S | 25/75 | 25/75 | 25/75 | 25/75 | 25/50 | 25/50 | 25/25 | 25/25 |
| Water absorption | 0.5 | 0.6 | 0.7 | 1.2 | 1.3 | 1.2 | 1.2 | 1.3 |

TABLE 2-5

| Comparative example No. | 9 | 10 | 11 | 12 | 13 | 14 | 15 | 16 |
|---|---|---|---|---|---|---|---|---|
| Flexibility 6.0 | 5.5 | 6.2 | 2.5 | 2.3 | 2.7 | 6.2 | 6.0 | |
| Cold/hot cycle resistance (−55-125° C.) 15 minutes | 450 | 300 | 400 | 300 | 300 | 350 | 450 | 400 |
| Moisture resistance | R | R | R | R | R | R | R | R |
| Tack-dryness | R | R | R | R | R | R | R | R |
| Photosensitivity | R | R | R | R | R | R | R | R |
| Developability | R | R | R | R | R | R | R | R |
| Adhesion | Q | Q | Q | R | R | Q | Q | Q |
| Pencil hardness | 5 H | 6 H | 5 H | 6 H | 6 H | 5 H | 5 H | 5 H |
| Acid resistance | Q | Q | Q | R | R | Q | Q | Q |
| Alkali resistance | Q | Q | Q | Q | Q | Q | Q | Q |
| Solvent resistance | R | R | R | Q | Q | Q | R | R |
| Metallization stability | Q | Q | Q | R | R | R | Q | Q |
| Solder resistance | R | R | R | Q | Q | Q | R | R |
| Flux resistance | R | R | Q | Q | Q | Q | R | R |
| Insulation resistance (humid conditions) × $10^{12}$ Ω | 7.0 | 7.3 | 6.6 | 9.5 | 8.0 | 8.0 | 8.5 | 8.4 |
| Insulation resistance under humid conditions (measured in moisture) | $10^9$ | $10^9$ | $10^9$ | $10^8$ | $10^8$ | $10^8$ | $10^8$ | $10^8$ |
| Resolution L/S | 25/25 | 25/25 | 25/50 | 25/75 | 25/50 | 25/75 | 25/50 | 25/50 |
| Water absorption | 1.2 | 1.3 | 1.2 | 0.9 | 1.0 | 0.8 | 1.4 | 1.5 |

TABLE 2-6

| Comparative example No. | 17 | 18 | 19 | 20 | 21 | 22 | 23 | 24 |
|---|---|---|---|---|---|---|---|---|
| Flexibility 6.0 | 4.0 | 6.0 | 2.5 | 3.0 | 6.0 | 6.0 | 6.0 | |
| Cold/hot cycle resistance (−55-125° C.) 15 minutes | 400 | 400 | 200 | 250 | 200 | 400 | 400 | 500 |
| Moisture resistance | R | R | R | R | R | R | R | R |
| Tack-dryness | Q | R | R | Q | Q | Q | Q | Q |
| Photosensitivity | Q | R | R | Q | Q | Q | Q | Q |
| Developability | Q | Q | Q | Q | Q | Q | Q | Q |
| Adhesion | Q | Q | Q | Q | Q | Q | Q | Q |
| Pencil hardness | 5 H | 5 H | 5 H | 6 H | 5 H | 5 H | 5 H | 5 H |
| Acid resistance | Q | Q | Q | Q | Q | Q | Q | Q |
| Alkali resistance | Q | Q | Q | Q | Q | Q | Q | Q |
| Solvent resistance | Q | Q | Q | Q | Q | Q | Q | Q |
| Metallization stability | Q | Q | Q | Q | Q | Q | Q | Q |
| Solder resistance | Q | Q | Q | Q | Q | Q | Q | Q |
| Flux resistance | Q | Q | Q | Q | Q | Q | Q | Q |
| Insulation resistance (humid conditions) × $10^{12}$ Ω | 7.5 | 8.0 | 5.0 | 6.0 | 5.0 | 6.5 | 7.0 | 8.0 |
| Insulation resistance under humid conditions (measured in moisture) | $10^9$ | $10^8$ | $10^8$ | $10^8$ | $10^9$ | $10^9$ | $10^9$ | $10^9$ |
| Resolution L/S | 25/50 | 25/50 | 25/75 | 25/50 | 25/75 | 25/50 | 25/50 | 25/50 |
| Water absorption | 1.3 | 1.2 | 1.0 | 0.8 | 1.0 | 1.2 | 1.3 | 1.2 |

What is claimed is:

1. A resin composition comprising:

(i) an at least bifunctional prepolymer (A) curable under the action of heat selected from the group consisting of an epoxy compound having more than one epoxide group per molecule, an acrylate resin, a polyurethane resin, a cyanate ester resin, a benzoxazine resin, a polyphenylene resin, a polyimide resin and mixtures thereof;

(ii) a telechelic elastomer;

(iii) a particulate material having an elastomeric core and a thermoplastic shell; and (iv) a photocurable prepolymer (B) selected from the group consisting of: a photocurable prepolymer having an acid value of from 40 to 250 mg KOH/g obtained by the reaction of an unsaturated monobasic acid copolymer resin with a compound which contains an alicyclic epoxy group; a photocurable prepolymer obtained by complete esterification of epoxy groups of an epoxy resin with an α,β-unsaturated carboxylic acid with formation of a first product and subsequent reaction of the first product thus obtained with a saturated or an unsaturated polybasic acid anhydride; a photocurable prepolymer obtained by the reaction of a bisphenol A epoxy resin with epichlorohydrin with formation of a postglycidylated epoxy resin, subsequent complete esterification of the epoxy groups of the postglycidylated epoxy resin with an α,β-unsaturated carboxylic acid with formation of a second product and subsequent reaction of the second product thus obtained with a saturated or an unsaturated polybasic anhydride; and a photocurable prepolymer obtained by the reaction of a bisphenol A epoxy resin with epichlorohydrin with formation of a postglycidylated epoxy resin, mixing of the postglycidylated epoxy resin with a novolak epoxy resin, complete esterification of the mixture with an α,β-unsaturated carboxylic acid with formation of a third product and subsequent reaction of the third product thus obtained with a saturated or unsaturated polybasic acid anhydride.

2. A resin composition according to claim 1, which additionally comprises a photopolymerization initiator.

3. A resin composition according to claim 1, which additionally comprises an epoxide curing agent.

4. A resin composition according to claim 1, which additionally comprises fillers.

5. A resin composition according to claim 1, in which the prepolymer (A) curable by the action of heat is an epoxy compound having more than one epoxide group per molecule.

6. A resin composition according to claim 1, in which the telechelic elastomer contains a hetero atom.

7. A resin composition according to claim 1, in which the telechelic elastomer has the formula I

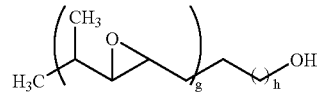

in which g is a number from 1 to 20 and h a number from 1 to 400.

8. A resin composition according to claim 1, in which the particulate material has a core comprising a silicone resin and shell comprising an acrylate resin.

9. A resin composition according to claim 1, in which the weight ratio of (ii) the telechelic elastomer to (iii) the particulate material is from 1:5 to 5:1.

10. A resin composition according to claim 1, in which the photocurable prepolymer (B) is a compound of the formula

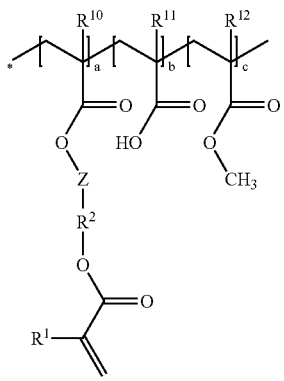

in which
- $R^1$ is hydrogen or a methyl group;
- $R^2$ is a divalent aliphatic saturated hydrocarbon group having 1-14 carbon atoms,
- $R^{10}$, $R^{11}$ and $R^{12}$, independently of one another, are hydrogen or a methyl group,
- Z is a direct bond or a divalent cycloalkane having 5 to 10 carbon atoms,
- a is a number from 1 to 10, and
- b and c are, independently numbers from 0 to 10.

11. A resin composition according to claim 1, additionally comprising a compound of the formula (III)

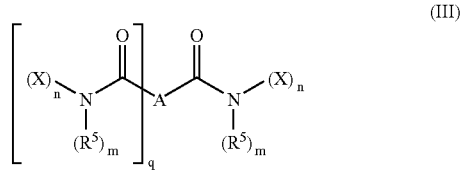

(III)

in which A is a mono- to tetravalent, saturated or unsaturated alkyl group having 1 to 60 carbon atoms or aryl group, a dialkylamino group (q =0) or a bivalent monoalkylamino group (q =1) having 1 to 4 carbon atoms, carboxyalkylene groups or alkoxycarbonylalkylene groups having 1 to 4 carbon atoms,
n is 1 or 2, m is 2−n and q is a number from 0 to 3,
X is a radical of the formula

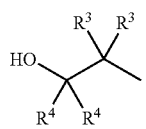

in which $R^3$ and $R^4$ are identical or different and each radical, independently of one another, is hydrogen, a straight-chain or branched alkyl group or hydroxyalkyl group having 1 to 5 carbon atoms, or $R^3$ and $R^4$ together may form an aliphatic ring and
$R^5$ is hydrogen or an alkyl group having 1 to 5 carbon atoms or a hydroxyalkyl group having 1 to 5 carbon atoms.

12. A resin composition according to claim 1, further comprising a compound of the formula (IV)

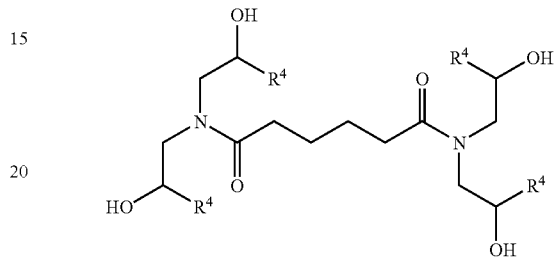

in which $R^4$ is hydrogen or a methyl group.

13. A printed circuit comprising a layer produced by curing a resin composition according to claim 1.

14. A printed circuit according to claim 13 in the form of a circuit board.

15. A packaging unit comprising two containers A and B, wherein container A comprises an at least bifunctional prepolymer (A) curable by the action of heat selected from the group consisting of an epoxy compound having more than one epoxide group per molecule, an acrylate resin, a polyurethane resin, a cyanate ester resin, a benzoxazine resin, a polyphenylene resin, a polyimide resin and mixtures thereof and container B comprises the remaining ingredients of the resin composition of claim 1.

16. A process for the production of a circuit board comprising the steps of forming a layer of the composition of claim 1 on the circuit board and curing the layer.

17. The process of claim 16, further comprising after formation of the layer, the step of drying the layer.

18. The process of claim 17, wherein the drying step is carried out at 60 to 90° C. and from 15 to 60 minutes.

19. The process of claim 16, in which, before the curing step, a photopolymerization is carried out through a photomask, and the unexposed composition is developed with a developing liquid with formation of a pattern.

* * * * *